United States Patent
Goto et al.

(10) Patent No.: US 10,398,069 B2
(45) Date of Patent: Aug. 27, 2019

(54) METHOD FOR MANUFACTURING ELECTRONIC COMPONENT

(71) Applicant: MURATA MANUFACTURING CO., LTD., Kyoto-fu (JP)

(72) Inventors: Seiji Goto, Nagaokakyo (JP); Takahiro Hirao, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 550 days.

(21) Appl. No.: 15/081,256

(22) Filed: Mar. 25, 2016

(65) Prior Publication Data

US 2016/0212895 A1 Jul. 21, 2016

Related U.S. Application Data

(63) Continuation of application No. PCT/JP2014/074811, filed on Sep. 19, 2014.

(30) Foreign Application Priority Data

Sep. 26, 2013 (JP) ................................. 2013-199863

(51) Int. Cl.
*H05K 13/00* (2006.01)
*H01G 4/30* (2006.01)
(Continued)

(52) U.S. Cl.
CPC .............. *H05K 13/00* (2013.01); *H01G 4/12* (2013.01); *H01G 4/30* (2013.01); *H01G 13/00* (2013.01);
(Continued)

(58) Field of Classification Search
CPC .......... H05K 13/0023; H05K 13/0015; H05K 13/0092; H01G 4/30; H01G 13/00; H01G 4/12; H03H 3/02; H03H 3/08
See application file for complete search history.

(56) References Cited

U.S. PATENT DOCUMENTS

| | | | | |
|---|---|---|---|---|
| 4,953,283 A | * | 9/1990 | Kawabata | .......... H05K 13/0084 |
| | | | | 118/503 |
| 5,049,980 A | * | 9/1991 | Saito | ................... H01L 21/4867 |
| | | | | 257/724 |
| 2012/0081868 A1 | * | 4/2012 | DePaula | .............. G06K 19/041 |
| | | | | 361/767 |

FOREIGN PATENT DOCUMENTS

| | | |
|---|---|---|
| JP | 02-024532 U1 | 2/1990 |
| JP | 08-306597 A | 11/1996 |
| JP | 08306597 A * | 11/1996 |

OTHER PUBLICATIONS

Machine translation JP 08306597 A to Yoshida is attached.*

(Continued)

*Primary Examiner* — Minh N Trinh
(74) *Attorney, Agent, or Firm* — Studebaker & Brackett PC

(57) ABSTRACT

A method for manufacturing an electronic component, and a device for manufacturing the electronic component, which can easily achieve alignment by inserting multilayer chips into cavities formed in a pallet, and form external electrodes with a high degree of dimensional accuracy. A plurality of multilayer chips each composed of a laminated body with a plurality of ceramic layers and a plurality of internal electrode layers is inserted into each of a plurality of cavities formed in a pallet, and the plurality of multilayer chips is aligned by moving each of the plurality of multilayer chips to one of inner wall surfaces forming the cavity. A conductive ink is applied onto ends of the plurality of aligned multilayer chips, including the upper surface of the pallet, and the conductive ink applied is dried to form external electrodes on the plurality of multilayer chips.

5 Claims, 9 Drawing Sheets

(51) Int. Cl.
*H01G 13/00* (2013.01)
*H01G 4/12* (2006.01)
*H03H 3/02* (2006.01)
*H03H 3/08* (2006.01)

(52) U.S. Cl.
CPC ..... *H05K 13/0015* (2013.01); *H05K 13/0092* (2013.01); *H03H 3/02* (2013.01); *H03H 3/08* (2013.01)

(56) References Cited

OTHER PUBLICATIONS

Original document merged with English translation of abstract JP 08306597 A to Yoshida is attached.*
International Search Report—PCT/JP2014/074811 dated Dec. 16, 2014.
Written Opinion—PCT/JP2014/074811 dated Dec. 16, 2014.

* cited by examiner

METHOD FOR MANUFACTURING ELECTRONIC COMPONENT

CROSS REFERENCE TO RELATED APPLICATIONS

This application claims benefit of priority to Japanese Patent Application 2013-199863 filed Sep. 26, 2013, and to International Patent Application No. PCT/JP2014/074811 filed Sep. 19, 2014, the entire content of which is incorporated herein by reference.

TECHNICAL FIELD

The present disclosure relates to a method for manufacturing an electronic component, and a device for manufacturing the electronic component, and more particularly, to a method for manufacturing an electronic component, and a device for manufacturing the electronic component, where the electronic component is manufactured with the use of a plurality of multilayer chips each composed of a laminated body with a plurality of ceramic layers and a plurality of internal electrode layers.

BACKGROUND

Conventionally, in the case of manufacturing an electronic component with the use of a plurality of multilayer chips each composed of a laminated body having a plurality of ceramic layers and a plurality of internal electrode layers, external electrodes are formed on the multilayer chips by immersing, in a dip layer, the plurality of multilayer chips sandwiched by a jig.

In a method of applying a conductive paste, which is disclosed in Japanese Patent Application Laid-Open No. 06-204271, central parts of cuboidal chip components are coated with glass or resin, and a conductive paste is then applied thereto. More specifically, for a number of cuboidal chip components attached to a jig while ends to which the conductive paste is to be applied are aligned to a predetermined protrusion height, the ends of the cuboidal chip components are immersed along with the jib in the conductive paste in a bath to apply the conductive paste to the ends.

SUMMARY

Problem to be Solved by the Disclosure

In the method of applying a conductive paste, which is disclosed in Japanese Patent Application Laid-Open No. 06-204271, on the grounds of the high viscosity of the conductive paste, the conductive layers formed as external electrodes are increased in film thickness, thereby decreasing the dimensional accuracy in thickness. Then, when in order to increase the dimensional accuracy in external electrode thickness, the viscosity of the conductive paste is lowered to reduce the conductive layers in film thickness, a so-called "upward wetting" phenomenon occurs in this case, thereby making it difficult to control the area of the external electrode, and causing the external electrodes to have curved profiles on side surfaces of the multilayer chips.

The present disclosure has been made in view of the foregoing circumstances, and an object of the disclosure is to provide a method for manufacturing an electronic component, and a device for manufacturing the electronic component, which can easily achieve alignment by inserting multilayer chips into cavities formed in a pallet, and form external electrodes with a high degree of dimensional accuracy.

Means for Solving the Problem

In order to achieve the object mentioned above, a method for manufacturing an electronic component according to the present disclosure is characterized in that the method includes: a first step of inserting a plurality of multilayer chips into a plurality of cavities formed in a pallet, respectively, the plurality of multilayer chips each including a laminated body having a plurality of ceramic layers and a plurality of internal electrode layers; a second step of aligning the plurality of multilayer chips by moving each of the plurality of multilayer chips to one of inner wall surfaces that form the cavities; a third step of applying a conductive ink to ends of the plurality of aligned multilayer chips, including an upper surface of the pallet; and a fourth step of drying the applied conductive ink to form external electrodes on the plurality of multilayer chips.

According to the aspect mentioned above, the plurality of multilayer chips each composed of the laminated body having the plurality of ceramic layers and the plurality of internal electrode layers is respectively inserted into the plurality of cavities formed in the pallet. The plurality of multilayer chips are aligned by the movement to one of the inner wall surfaces forming the cavity. To ends of the plurality of aligned multilayer chips, including the upper surface of the pallet, a conductive ink is applied, and the applied conductive ink is dried to form external electrodes on the plurality of multilayer chips. The conductive ink is applied to the multilayer chips inserted into the cavities provided in the pallet, and ink blot on the pallet can be thus minimized, thereby making it possible to reduce the defective percent of electronic components. In addition, the alignment accuracy can be enhanced while cutting down on labor for the alignment, thus making it possible to enhance the efficiency and speed of work. Furthermore, even when the viscosity of the conductive ink is lowered to reduce the conductive layers in film thickness, no so-called "upward wetting" phenomenon is caused, thereby making it easy to control the dimensions of the external electrodes.

In addition, in the method for manufacturing an electronic component according to the present disclosure, in the third step, preferably, a liquid repellent film that repels the conductive ink is provided on the upper surface of the pallet, and the conductive ink is applied.

According to the aspect mentioned above, the liquid repellent film that repels the conductive ink is provided on the upper surface of the pallet, and the conductive ink is applied. Thus, the conductive ink which adheres to the upper surface of the pallet in the application is guided into the cavities or positions for easy wiping, and ink blot on the pallet can be minimized, thereby making it possible to reduce the defective percent of electronic components.

In addition, in the method for manufacturing an electronic component according to the present disclosure, preferably, a slope portion that is sloped in a predetermined direction is formed on the upper surface of the pallet, and in the third step, the conductive ink is also applied to the slope surface of the slope portion.

According to the aspect mentioned above, the slope portion that is sloped in the predetermined direction is formed on the upper surface of the pallet, and the conductive ink is also applied to the slope surface of the slope portion. Thus, the conductive ink which adheres to the upper surface of the pallet in the application is guided into the cavities or positions for easy wiping, and ink blot on the pallet can be minimized, thereby making it possible to reduce the defective percent of electronic components.

In addition, in the method for manufacturing an electronic component according to the present disclosure, preferably, the slope portion has a mountain shape in cross section between adjacent cavities, and the slope portion is sloped in a direction in which the conductive ink flows down into each cavity.

According to the aspect mentioned above, the slope portion has a mountain shape in cross section between adjacent cavities, and the slope portion is sloped in the direction in which the conductive ink flows down into each cavity. Thus, the conductive ink which adheres to the upper surface of the pallet in the application is guided into the cavities, and ink blot on the pallet can be minimized, thereby making it possible to reduce the defective percent of electronic components.

In addition, in the method for manufacturing an electronic component according to the present disclosure, preferably, the slope portion has a valley shape in cross section between adjacent cavities, and the slope portion is sloped in a direction in which the conductive ink is collected in a predetermined position.

According to the aspect mentioned above, the slope portion has a valley shape in cross section between adjacent cavities, and the slope portion is sloped in a direction in which the conductive ink is collected in a predetermined position, for example, near the center between the adjacent cavities at the upper surface of the pallet. Thus, the conductive ink which adheres to the upper surface of the pallet in the application is guided into predetermined positions where the slope portions face each other, thereby making it easy to wipe off the ink. Accordingly, ink blot on the pallet can be minimized, thereby making it possible to reduce the defective percent of electronic components.

In addition, in the method for manufacturing an electronic component according to the present disclosure, the conductive ink is preferably applied by an ink-jet method in the third step.

According to the aspect mentioned above, the conductive ink is applied by an ink-jet method, and the high printing precision in the ink-jet method can thus increase the dimensional accuracy of external electrodes, without causing any so-called "upward wetting" phenomenon.

Next, in order to achieve the object mentioned above, a device for manufacturing an electronic component according to the present disclosure is characterized in that the device includes: an insertion unit for inserting a plurality of multilayer chips into each of a plurality of cavities formed in a pallet, respectively, the plurality of multilayer chips each including a laminated body having a plurality of ceramic layers and a plurality of internal electrode layers; an alignment unit for aligning the plurality of multilayer chips by moving each of the plurality of multilayer chips to one of inner wall surfaces that form the cavities; an application unit for applying a conductive ink to ends of the plurality of aligned multilayer chips, including an upper surface of the pallet; and a drying unit for drying the applied conductive ink to form external electrodes on the plurality of multilayer chips.

According to the aspect mentioned above, the plurality of multilayer chips each composed of the laminated body having the plurality of ceramic layers and the plurality of internal electrode layers are respectively inserted into the plurality of cavities formed in the pallet. The plurality of multilayer chips are aligned by the movement to one of the inner wall surfaces forming the cavity. To ends of the plurality of aligned multilayer chips, including the upper surface of the pallet, a conductive ink is applied, and the applied conductive ink is dried to form external electrodes on the plurality of multilayer chips. The conductive ink is applied to the multilayer chips inserted into the cavities provided in the pallet, and ink blot on the pallet can be thus minimized, thereby making it possible to reduce the defective percent of electronic components. In addition, the alignment accuracy can be enhanced while cutting down on labor for the alignment, thus making it possible to enhance the efficiency and speed of work. Furthermore, even when the viscosity of the conductive ink is lowered to reduce the conductive layers in film thickness, no so-called "upward wetting" phenomenon is caused, thereby making it easy to control the dimensions of the external electrodes.

Advantageous Effect of the Disclosure

According to the aspects mentioned above, the conductive ink is applied to the multilayer chips inserted into the cavities provided in the pallet, and ink blot on the pallet can be thus minimized, thereby making it possible to reduce the defective percent of electronic components. In addition, the alignment accuracy can be enhanced while cutting down on labor for the alignment, thus making it possible to enhance the efficiency and speed of work. Furthermore, even when the viscosity of the conductive ink is lowered to reduce the conductive layers in film thickness, no so-called "upward wetting" phenomenon is caused, thereby making it easy to control the dimensions of the external electrodes.

DETAILED DESCRIPTION

Figure 1:
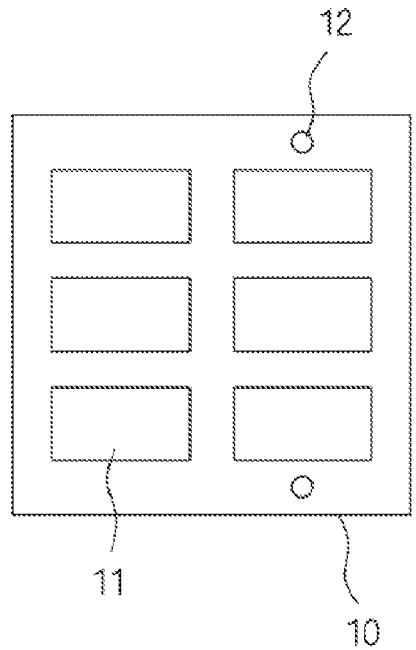
FIG. 1(a) through (c) are overhead schematic views illustrating a method for manufacturing an electronic component according to an embodiment of the present disclosure.
Figure 1:
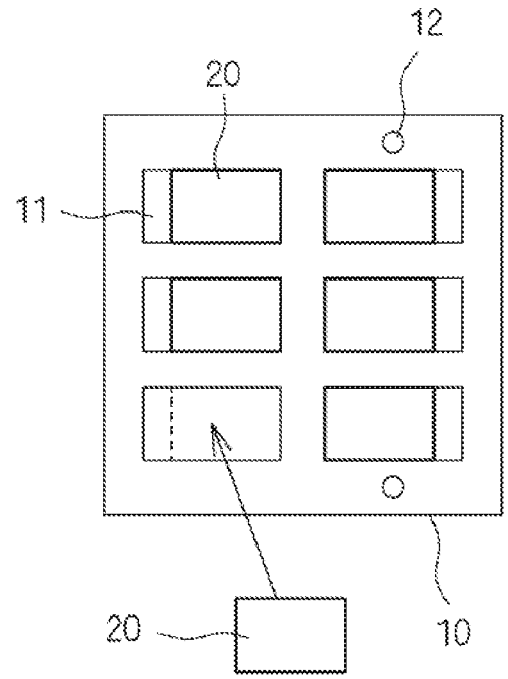
Figure 1:
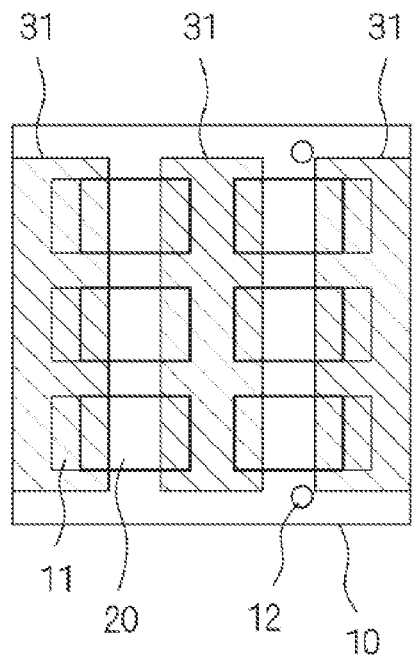

Embodiments of the present disclosure will be described in detail below with reference to the drawing. It is to be noted that examples of using an ink-jet method for the formation of external electrodes will be described in the present embodiment.

FIG. 1(a) through 1(c) are overhead schematic views illustrating a method for manufacturing an electronic component according to an embodiment of the present disclosure. The method for manufacturing an electronic component according to an embodiment of the present disclosure uses a plurality of multilayer chips each composed of a laminated body with a plurality of ceramic layers and a plurality of internal electrode layers. Examples of the electronic component manufactured include, for example, a multilayer ceramic capacitor, a surface-wave filter, and a ceramic oscillator.

First, as shown in FIG. 1(a), a pallet 10 is prepared which has a plurality of cavities 11 into which the multilayer chips are able to be inserted. The pallet 10 is made from a metal, and for example, formed from aluminum. The plurality of cavities 11 is provided in more than one column (two columns in FIG. 1(a) through (c)) in the pallet 10 to align one of the sides in a line so that the multilayer chips can be easily aligned. In addition, alignment marks 12 may be provided on the upper surface of the pallet 10.

Figure 2:
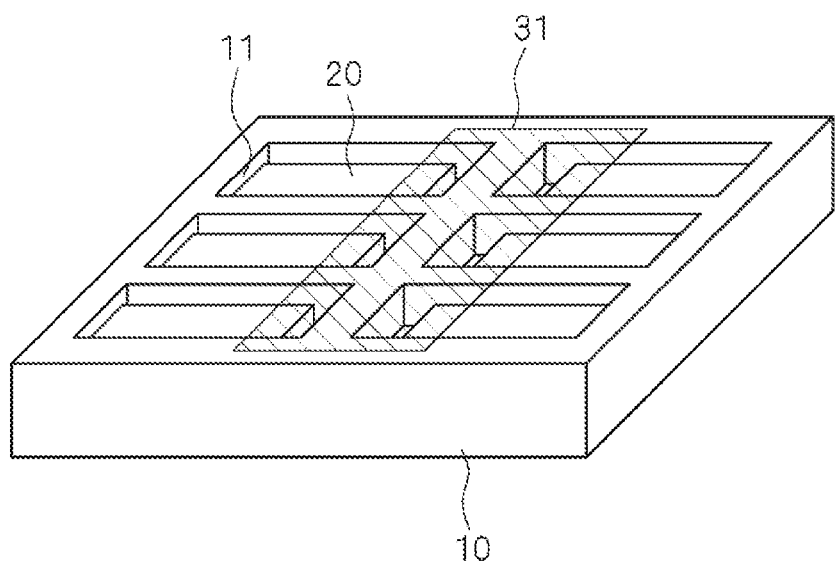
FIG. 2 is a perspective view of multilayer chips inserted in cavities in the method for manufacturing an electronic component according to the embodiment of the present disclosure.

FIG. 2 is a perspective view of multilayer chips inserted in the cavities 11 in the method for manufacturing an electronic component according to the embodiment of the present disclosure. As shown in FIG. 2, the depth of the cavity 11 is preferably larger than the thickness (height dimension) of the multilayer chip 20. In the case of forming external electrodes on both ends of the multilayer chips 20, a conductive ink 31 is applied, including not only in the cavities 11, but also the upper surface of the pallet 10. The reason is that when the depth of the cavity 11 is larger than the thickness of the multilayer chip 20, the conductive ink 31 applied to the upper surface of the pallet 10 can be guided into the cavities 11 or positions for easy wiping as will be described later.

Returning to FIG. 1(a) through 1(c), next, as shown in FIG. 1(b), the multilayer chips 20 are inserted respectively into the plurality of cavities 11 with the use of an insertion device such as a mounter. The multilayer chips 20 are fired at the time of insertion into the cavities 11. The vertical dimension of the cavity 11 is larger than the width dimension of the multilayer chip 20, whereas the horizontal dimension of the cavity 11 is longer than the length dimension of the multilayer chip 20. Further, while the cavities 11 are formed in more than one column to align one of the sides in a line, the inserted multilayer chips 20 are moved to any one side of the cavities 11 formed to be aligned in a line. In this way, the multilayer chips 20 can be easily aligned.

Figure 3:
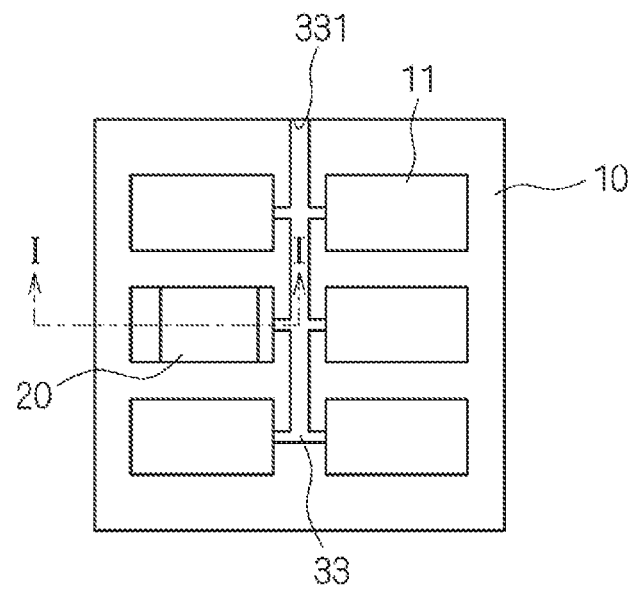
FIGS. 3(a) and 3(b) are explanatory diagrams of a way for aligning the multilayer chips in the method for manufacturing an electronic component according to the embodiment of the present disclosure.
Figure 3:
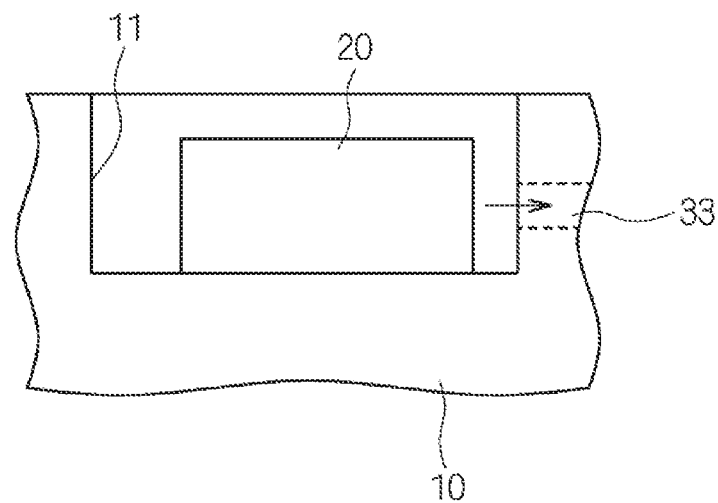

FIGS. 3(a) and 3(b) are explanatory diagrams of a device for aligning the multilayer chips 20 in the method for manufacturing an electronic component according to the embodiment of the present disclosure. FIG. 3(a) is a layout of a suction pipe that connects the plurality of cavities 11, and FIG. 3(b) is a partially enlarged cross-sectional view of one of the cavities 11 along the line I-I.

In FIGS. 3(a) and 3(b), a suction device composed of a suction pump or the like is used as an alignment device. As shown in FIG. 3(a), a suction pipe 33 is connected to each of the wall surfaces that form the cavities 11, which are closer to the center of the pallet 10, and the air in the cavities 11 is guided through the suction pipe 33 connecting the plurality of cavities 11 to each other, to a suction port 331 provided at one wall surface of the pallet 10. As shown in FIG. 3(b), with the multilayer chip 20 inserted in the cavity 11, the air in the cavity 11 is suctioned from the suction pipe 33 through a suction pump (not shown) connected to the suction port 331. Thus, the multilayer chip 20 moves to the wall surface forming the cavity 11 on the side closer to the center of the pallet 10 (in a direction of the arrow in FIG. 3(b)), thus making it possible to easily align the multilayer chip 20.

Figure 4:
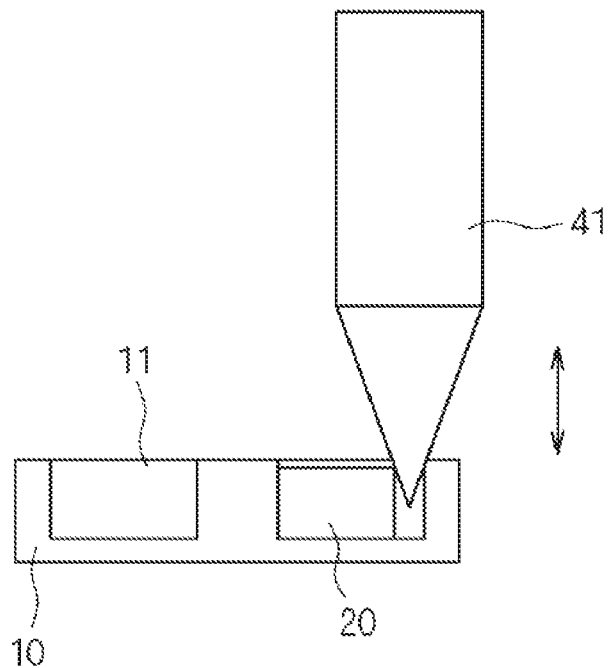
FIG. 4 is an explanatory diagram of another way for aligning multilayer chips in a method for manufacturing an electronic component according to an embodiment of the present disclosure.

As a matter of course, the disclosure is not to be considered limited to the use of the suction device such as a suction pump as a device for aligning the multilayer chips 20. FIG. 4 is an explanatory diagram of another device for aligning the multilayer chips 20 in a method for manufacturing an electronic component according to an embodiment of the present disclosure.

As shown in FIG. 4, with a multilayer chip 20 inserted in a cavity 11, an adjustment member 41 with a wedge-shaped tip is moved up and down. In the example of FIG. 4, the adjustment member 41 is moved up and down so that the tip of the adjustment member 41 is inserted between the multilayer chip 20 and a right-hand wall surface of the cavity 11. Because of the wedge-shaped tip of the adjustment member 41, the multilayer chip 20 moves to the left side with the ups and downs of the adjustment member 41, and moves to the left-hand wall surface of the cavity 11, thus making alignment possible. Also in the case of achieving alignment by the movement to the right-hand wall surface of the cavity 11, the same applies except for changing the position into which the adjustment member 41 is inserted.

Returning to FIG. 1(a) through 1(c), as shown in FIG. 1(c), the conductive ink 31 is applied by an ink-jet method (application process) to ends of the multilayer chips 20, including the upper surface of the pallet 10. In FIG. 1(c), on the grounds that the multilayer chips 20 are aligned by the movement to the inner wall surfaces forming the cavities 11 on the side closer to the center of the pallet 10, first, the conductive ink 31 is applied by an ink-jet method to ends of the multilayer chips 20 on the side closer to the center of the pallet 10 with the multilayer chips 20 moved thereto, including the upper surface of the pallet 10, and next, the conductive ink 31 is applied to respective ends of the multilayer chips 20 on the side opposite to the inner wall surfaces of the cavities 11 with the multilayer chips 20 moved thereto, including the upper surface of the pallet 10. In the case of more columns of cavities, the same printing treatment is repeated.

Figure 5:
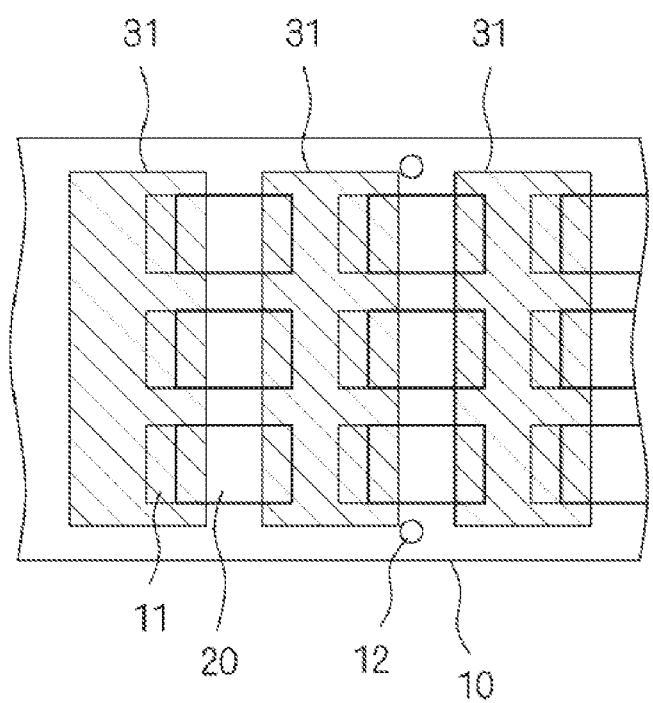
FIG. 5 is another overhead schematic view illustrating a method for manufacturing an electronic component according to an embodiment of the present disclosure.

As a matter of course, the disclosure is not to be considered limited to the alignment of the multilayer chips 20 by the movement to the inner wall surfaces forming the cavities 11 on the side closer to the pallet 10. FIG. 5 is another overhead schematic view illustrating a method for manufacturing an electronic component according to an embodiment of the present disclosure. For example, as shown in FIG. 5, the multilayer chips 20 may be aligned by the movement to the right-hand inner wall surfaces of the cavities 11. In this case, first, the conductive ink 31 is applied by an ink-jet method to the ends of the multilayer chips 20 on the side closer to the center of the pallet 10, including the upper surface of the pallet 10, and next, the conductive ink 31 is applied to respective opposite ends of the multilayer chips 20 on the side opposite to the center of the pallet 10, including the upper surface of the pallet 10. When multiple columns of cavities 11 are formed, in the case of FIG. 1(c), there is a need to vary the printing width of the conductive ink 31, whereas there is advantageously no need to vary the printing width in the case of FIG. 5.

It is preferable to use an ink-jet method for the application process as in the present embodiment. This is because a high printing precision in an ink-jet method can increase the dimensional accuracy of external electrodes, thereby causing no so-called "upward wetting" phenomenon.

Next, the conductive ink 31 applied to both ends of the multilayer chips 20 is dried by a drying device. While the drying device is not particularly shown in the figure, the ink may be dried by blowing the air with a fan or the like, or may be dried by heating with a heater or the like. The steps described above are carried out for both the front and back surfaces of the multilayer chips 20, thereby making it possible to form external electrodes of electronic components with a high degree of precision.

Figure 6:
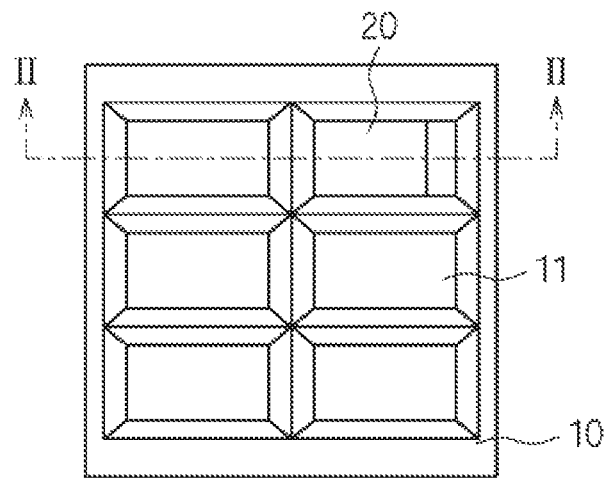
FIGS. 6(a) and 6(b) are pattern diagrams illustrating the upper surface construction of a pallet in a method for manufacturing an electronic component according to an embodiment of the present disclosure.
Figure 6:
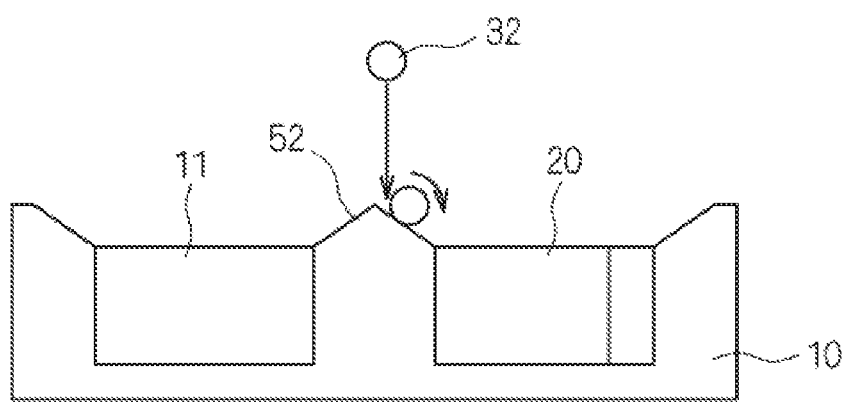

In addition, the conductive ink 31 does preferably not remain on the upper surface of the pallet 10. This is because the ink blot of the pallet 10 is likely to contaminate electronic components, and have the possibility of decreasing the manufacturing quality. Therefore, in the present embodiment, the upper surface of the pallet 10 has a sloping part formed to be sloped in a predetermined direction. FIGS. 6(a) and 6(b) are pattern diagrams illustrating the upper surface construction of the pallet 10 in a method for manufacturing an electronic component according to an embodiment of the present disclosure. FIG. 6(a) is a plan view illustrating an arrangement of the cavities 11 and multilayer chips 20 of the pallet 10, and FIG. 6(b) is a cross-sectional view of FIG. 6(a) along the line II-II.

As shown in FIG. 6(b), the upper surface of the pallet 10 has a slope portion 52 formed to have a mountain shape in cross section between adjacent cavities 11, and have a slope such that droplets 32 of the conductive ink 31 are guided into the cavities 11. The droplets 32 of the conductive ink 31 are not dried, and thus flow down into the cavities 11 along the slope of the slope portion 52. Thus, the conductive ink 31 does not remain on the upper surface of the pallet 10.

As just described, the slope portion 52 has a slope such that the droplets 32 of the conductive ink are guided into the cavities 11, thereby causing the conductive ink 31 applied to the upper surface of the pallet 10 to fall down into the cavities 11, minimizing the conductive ink 31 remaining on the upper surface of the pallet 10, and making it possible to reduce the defective percent of electronic components.

Figure 7:
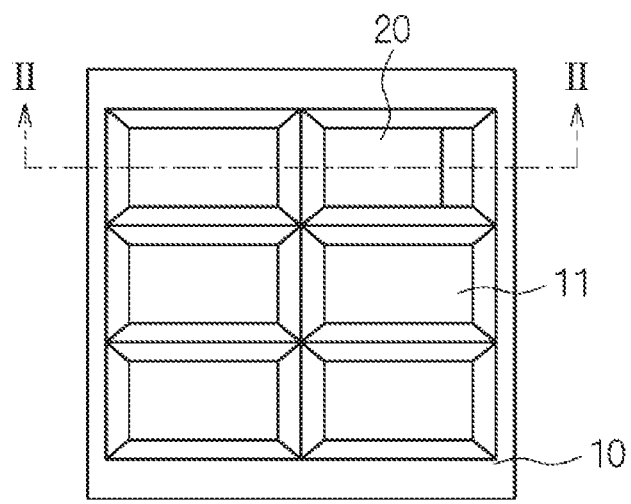
FIGS. 7(a) and 7(b) are patterns diagram illustrating another upper surface construction of the pallet in a method for manufacturing an electronic component according to an embodiment of the present disclosure.
Figure 7:
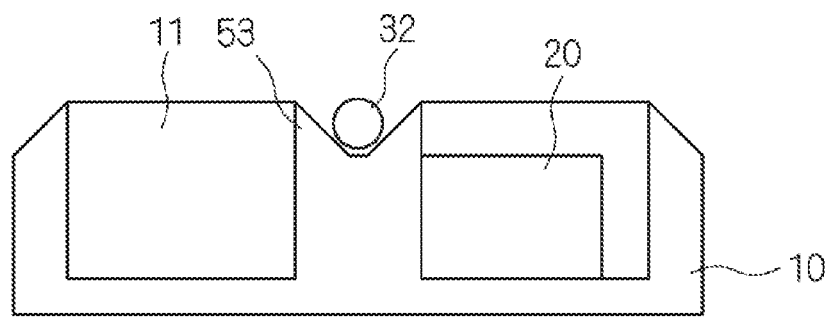

It is to be noted that the slope of the slope portion 52 is not to be considered limited to the direction in which the droplets 32 of the conductive ink 31 are guided into the cavities 11. FIGS. 7(a) and 7(b) are pattern diagrams illustrating another upper surface construction of the pallet 10 in a method for manufacturing an electronic component according to an embodiment of the present disclosure. FIG. 7(a) is a plan view illustrating an arrangement of the cavities 11 and multilayer chips 20 of the pallet 10, and FIG. 7(b) is a cross-sectional view of FIG. 7(a) along the line II-II.

As shown in FIG. 7(b), the upper surface of the pallet 10 may have a slope portion 53 formed to have a valley shape in cross section between adjacent cavities 11, and have a slope such that droplets 32 of the applied conductive ink 31 are guided into predetermined positions. This is because the droplets 32 of the conductive ink 31 guided into the predetermined positions can be easily wiped off. This configuration collects the droplets 32 of the conductive ink 31 in the predetermined positions between the adjacent cavities 11, thus making it possible to easily wipe off the droplets. In addition, at ends of the pallet 10, the upper surface has slopes to be lower in height toward the outside, thereby causing the droplets 32 of the conductive ink 31 to fall down to the outside of the pallet 10, and the conductive ink 31 does thus not remain on the upper surface of the pallet 10.

As just described, with the slope portion 53, the upper surface of the pallet 10 is sloped such that the droplets 32 of the conductive ink 31 are guided into the predetermined positions, thereby guiding the droplets 32 of the conductive ink 31 applied to the upper surface of the pallet 10 into the predetermined positions (central valleys of the pallet 10), and making it easy to wipe off the droplets. Therefore, the ink blot caused by the conductive ink 31 remaining on the upper surface of the pallet 10 can be minimized, thereby making it possible to reduce the defective percent of electronic components.

Figure 8:
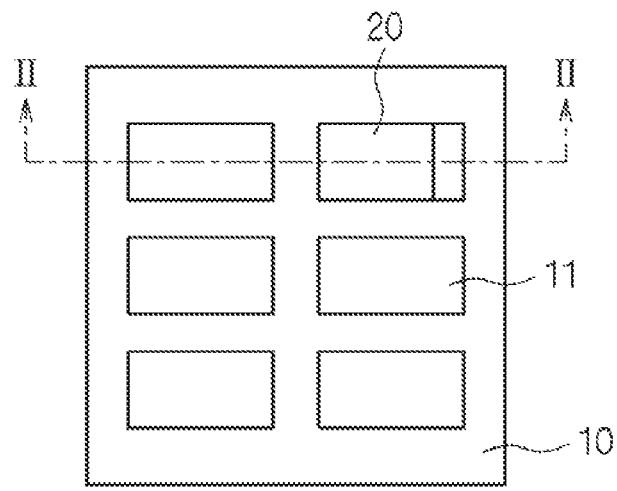
FIGS. 8(a) and 8(b) are pattern diagrams illustrating the upper surface construction of a pallet in a method for manufacturing an electronic component according to an embodiment of the present disclosure.
Figure 8:
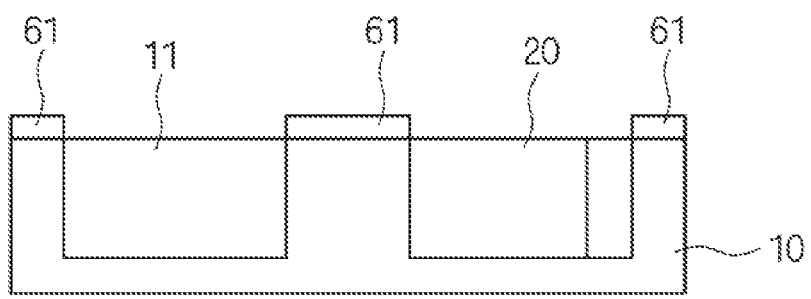

The configuration for keeping the conductive ink 31 from remaining on the upper surface of the pallet 10 is not to be considered limited to the formation of the slope portion 52, 53 that is sloped in a predetermined direction on the upper surface of the pallet 10. For example, a liquid repellent film that repels the droplets 32 of the conductive ink 31 may be provided on the upper surface of the pallet 10. FIGS. 8(a) and 8(b) are pattern diagrams illustrating the upper surface construction of the pallet 10 in a method for manufacturing an electronic component according to an embodiment of the present disclosure. FIG. 8(a) is a plan view illustrating an arrangement of the cavities 11 and multilayer chips 20 of the pallet 10, and FIG. 8(b) is a cross-sectional view of FIG. 8(a) along the line II-II.

As shown in FIG. 8(b), a liquid repellent film 61 that repels the droplets 32 of the conductive ink 31 is provided on the upper surface of the pallet 10. As the liquid repellent film 61, a fluorine or silicone-based liquid repellent agent may be applied, or plasma may be used to apply a molecular coating that contains fluorine. The droplets 32 of the conductive ink 31 are not dried, thus repelled by the liquid repellent film 61 that repels the droplets 32 of the conductive ink 31, thereby falling down into the cavities 11 or to the outside of the pallet 10. Thus, the conductive ink 31 does not remain on the upper surface of the pallet 10.

As just described, the liquid repellent film 61 that repels the droplets 32 of the conductive ink 31 is provided on the upper surface of the pallet 10, thereby causing the droplets 32 of the conductive ink 31 to fall down into the cavities 11 or to the outside of the pallet 10, thus minimizing the ink blot caused by the conductive ink 31 remaining on the upper surface of the pallet 10, and making it possible to reduce the defective percent of electronic components.

Figure 9:
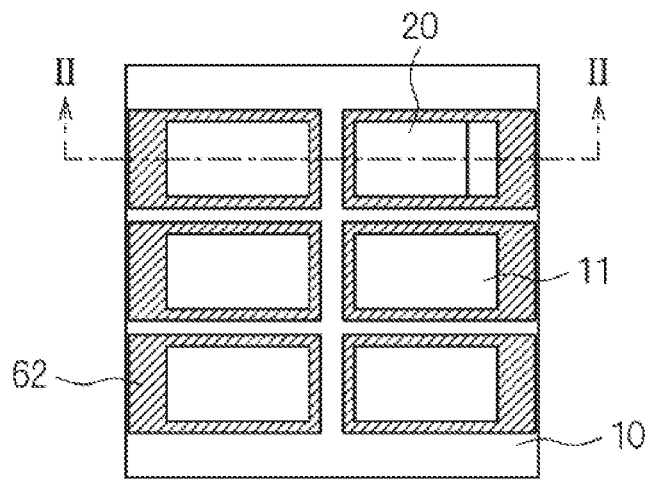
FIGS. 9(a) and 9(b) are pattern diagrams illustrating another upper surface construction of the pallet in a method for manufacturing an electronic component according to an embodiment of the present disclosure.
Figure 9:
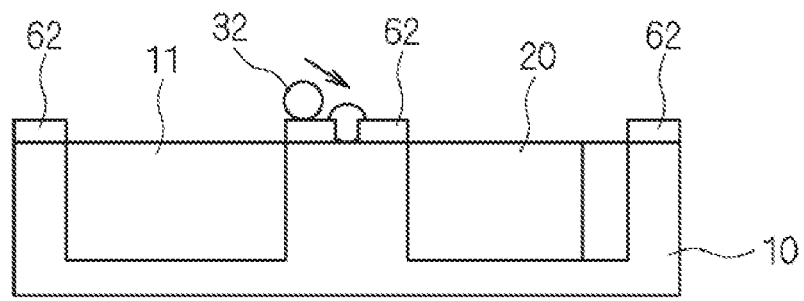

It is to be noted that a liquid repellent film 62 may be provided so that the droplets 32 of the conductive ink 31 applied are guided into predetermined positions on the upper surface of the pallet 10. FIGS. 9(a) and 9(b) are pattern diagrams illustrating another upper surface construction of the pallet 10 in a method for manufacturing an electronic component according to an embodiment of the present disclosure. FIG. 9(a) is a plan view illustrating an arrangement of the cavities 11 and multilayer chips 20 of the pallet 10, and FIG. 9(b) is a cross-sectional view of FIG. 9(a) along the line II-II.

As shown in FIG. 9(b), there is a region without the liquid repellent film 62 provided, such that the droplets 32 of the conductive ink 31 are retained near the center (in the predetermined position) on the upper surface of the pallet 10 between the adjacent cavities 11. This collects the droplets 32 of the conductive ink 31 on the upper surface of the pallet 10 in the region without the liquid repellent film 62 provided, thus making it possible to easily wipe off the droplets.

Furthermore, the slope surfaces of the slope portions 52, 53 shown in FIG. 6(a), 6(b), 7(a) and 7(b) may be provided with the liquid repellent film 62. Thus, the droplets 32 of the undried conductive ink 31 are made more likely to be guided, and the conductive ink 31 applied on the upper surface of the pallet 10 can be prevented from remaining.

As described above, in the method for manufacturing an electronic component according to the embodiment of the present disclosure, the plurality of multilayer chips 20 each composed of the laminated body with the plurality of ceramic layers and the plurality of internal electrode layers is inserted into the cavities 11 formed in the pallet 10. The plurality of multilayer chips 20 inserted is aligned by the movement to one of the inner wall surfaces that form the cavities 11. The conductive ink 31 is applied onto both ends of the plurality of aligned multilayer chips 20, including the upper surface of the pallet 10, and the conductive ink 31 is dried to form external electrodes. On the upper surface of the pallet 10, the slope portion 52, 53 that is sloped in a predetermined direction is formed, and/or the liquid repellent film 61, 62 that repels the droplets 32 of the conductive ink 31 is provided, thus making it possible to minimize the ink blot caused by the conductive ink 31 remaining on the upper surface of the pallet 10, and making it possible to reduce the defective percent of electronic components. In addition, the alignment accuracy can be enhanced while cutting down on labor for the alignment of the multilayer chips 20, thus making it possible to enhance the efficiency and speed of work. Furthermore, even when the conductive layers formed as external electrodes are reduced in film thickness, no so-called "upward wetting" phenomenon is caused, thereby making it easy to control the dimensions of the external electrodes.

Besides, it will be obvious that the embodiments described above can be modified without departing from the scope of the present disclosure. While the ink-jet method is used as a way for applying the conductive ink in the embodiments described above, the present disclosure is not to be considered particularly limited to this method, but various printing devices can be used such as, for example, non-contact printing devices other than ink-jet methods, e.g., dispensers and micropipettes, and contact printing devices such as screen printing and stamp devices.

The invention claimed is:

1. A method for manufacturing an electronic component, the method comprising:
    inserting a plurality of multilayer chips into a plurality of cavities formed in a pallet, respectively, the plurality of multilayer chips each including a laminated body having a plurality of ceramic layers and a plurality of internal electrode layers;
    aligning the plurality of multilayer chips by moving each of the plurality of multilayer chips to one of inner wall surfaces that form the cavities;
    providing a liquid repellent film that repels a conductive ink on an upper surface of the pallet;
    applying the conductive ink to ends of the plurality of aligned multilayer chips, and the liquid repellent film on the upper surface of the pallet; and
    drying the applied conductive ink to form external electrodes on the plurality of multilayer chips
    wherein in the applying step, the conductive ink which adheres to the upper surface of the pallet in the application is guided into the cavities or a region of the upper surface of the pallet, the region being a region without the liquid repellent film provided.

2. The method for manufacturing an electronic component according to claim 1, wherein the conductive ink is applied by an ink-jet method.

3. A method for manufacturing an electronic component, the method comprising:
    inserting a plurality of multilayer chips into a plurality of cavities formed in a pallet, respectively, the plurality of multilayer chips each including a laminated body having a plurality of ceramic layers and a plurality of internal electrode layers;
    aligning the plurality of multilayer chips by moving each of the plurality of multilayer chips to one of inner wall surfaces that form the cavities;
    applying a conductive ink to ends of the plurality of aligned multilayer chips, and an upper surface of the pallet; and
    drying the applied conductive ink to form external electrodes on the plurality of multilayer chips, wherein
    a slope portion that is sloped in a predetermined direction is formed on the upper surface of the pallet, and
    the conductive ink is also applied to a slope surface of the slope portion.

4. The method for manufacturing an electronic component according to claim 3, wherein the slope portion has a mountain shape in cross section between adjacent cavities, and the slope portion is sloped in a direction in which the conductive ink flows down into each cavity.

5. The method for manufacturing an electronic component according to claim 3, wherein the slope portion has a valley shape in cross section between adjacent cavities, and the slope portion is sloped in a direction in which the conductive ink is collected in a predetermined position.

* * * * *